United States Patent [19]

Janesick

[11] Patent Number: 5,844,598
[45] Date of Patent: Dec. 1, 1998

[54] CCD BASED OPTICAL DETECTOR FOR A CONFOCAL MICROSCOPE

[75] Inventor: James R. Janesick, Huntington Beach, Calif.

[73] Assignee: Pixel Vision, Inc., Lexington, Ky.

[21] Appl. No.: 588,527

[22] Filed: Jan. 17, 1996

[51] Int. Cl.⁶ .............................. H04N 7/18; H04N 5/335; H04N 3/08

[52] U.S. Cl. .............................. 348/79; 348/203; 348/306; 348/313; 250/201.3; 257/241

[58] Field of Search .............................. 250/201.3, 208.2; 348/61, 79, 80, 195, 202, 203, 206, 294, 306, 309, 311, 313, 315–324, 345, 349, 350, 351–356; 257/239, 240, 241; H04N 5/335, 3/08, 7/18

[56] References Cited

U.S. PATENT DOCUMENTS

| | | | |
|---|---|---|---|
| 3,947,698 | 3/1976 | Cheek, Jr. et al. | 307/221 D |
| 4,092,734 | 5/1978 | Collins et al. | 365/238 |
| 4,162,411 | 7/1979 | Sakaue et al. | 307/221 D |
| 4,236,830 | 12/1980 | Schlig | 357/24 |
| 4,387,402 | 6/1983 | Lewis | 348/306 |
| 4,493,060 | 1/1985 | Varshney | 365/238 |
| 4,760,031 | 7/1988 | Janesick . | |
| 4,807,038 | 2/1989 | Michon | 348/306 |
| 4,963,952 | 10/1990 | Janesick . | |
| 4,965,648 | 10/1990 | Yang et al. | 357/24 |
| 5,005,063 | 4/1991 | Janesick . | |
| 5,068,701 | 11/1991 | Prieur-Drevon | 357/24 |
| 5,077,592 | 12/1991 | Janesick . | |
| 5,250,824 | 10/1993 | Janesick . | |
| 5,365,092 | 11/1994 | Janesick . | |

OTHER PUBLICATIONS

Handbook of Biological Confocal Microscopy Second Edition, Edited by James B. Pawley, Chapter 1, Appendix 2, Plenum Press, New York and London, publication date unknown, pp. 584–597.

*Primary Examiner*—Andrew I. Faile
*Assistant Examiner*—Ngoc-Yen Vu
*Attorney, Agent, or Firm*—Smith-Hill and Bedell

[57] ABSTRACT

An optical detector includes a charge-coupled device (CCD). The CCD comprises an active cell for receiving a narrow beam of incident illumination and generating photoelectrons in response thereto, and a first stage readout register comprising a row of N transfer cells, where N>1. A first stage gate structure transfers charge packets consecutively from the active cell into the first stage readout register, whereby N successive charge packets are read into the N cells respectively of the first stage readout register. N second stage readout registers each comprise M transfer cells, where M>1, and a second stage gate structure transfers N charge packets from the N cells of the first stage readout register into respective first cells of the second stage readout registers and subsequently shifts the N charge packets from the respective first cells of the second stage readout registers to respective Mth cells thereof. A multiplexer has N inputs coupled respectively to the Mth cells of the second stage readout registers. The multiplexer is operative to connect a selected input to its output. The multiplexer provides an output signal that varies in accordance with variation in intensity of incident illumination on the active cell.

21 Claims, 7 Drawing Sheets

CCD BASED OPTICAL DETECTOR FOR A CONFOCAL MICROSCOPE

BACKGROUND OF THE INVENTION

This invention relates to a CCD-based optical detector for a confocal microscope.

A known type of confocal microscope camera comprises, as shown in FIG. 11, a light source 10 that provides a narrow beam of light directed along the axis of an optical system 12. The optical system provides an output beam directed to an X-Y scanner 16. The scanner 16 directs the beam toward an objective lens 20 that brings the beam to a focus in an object plane 24. The optical system 12 in conjunction with the objective lens 20 focuses the beam to illuminate a very small spot (perhaps 40 µm in diameter) in the object plane 24. The scanner 16 deflects the beam such that the light spot in the plane 24 executes a raster scan. It will be appreciated that the optical axis between the scanner and the object plane cannot be coplanar with the optical axis between the scanner and the light source, and that the illustration in FIG. 11 is simplified for clarity.

The scanner 16 operates in response to drive signals provided by a scanner controller 18. The scanner controller also provides horizontal and vertical sync signals, reflecting the deflection of the light spot, to a video processor 30.

Light from the object plane traverses the objective lens 20 and is descanned by the scanner 16. The descanned light beam is directed by a beam splitter 26 toward a photomultiplier 28. The aperture of the photomultiplier is optically conjugate with the aperture of the light source 10 and therefore the aperture of the photomultiplier samples the intensity of light at the point in the plane 24 that is currently illuminated by the beam from the light source. The signal provided by the photomultiplier is provided to the video processor 30, which combines the photomultiplier signal with the sync signals provided by the scanner controller 18 to provide a composite video signal. The composite video signal is applied to a raster scan display device 34, which displays an image of the object plane.

By adjusting the position of the object plane 24 relative to a specimen being examined, for example by use of optics between the beam splitter 26 and the object plane, a confocal microscope of this type may be used to build up a three-dimensional image of an object.

The aperture of the photomultiplier is small and the depth of focus of the object plane 24 at the aperture of the photomultiplier 28 is small and accordingly it is rather difficult to position the photomultiplier so that its aperture samples the light from the area in the object plane that is currently illuminated.

It is known to use a charge-coupled device (CCD) as a detector for optical radiation. Generally, CCDs that are used as optical detectors have an array of active pixels that is extended in at least one dimension (either a linear array or a rectangular array). Charge packets are shifted sequentially through a linear readout register and are dumped into a floating diffusion, and the voltage of the floating diffusion is sensed using a readout amplifier. The output voltage of the readout amplifier is digitized, and the resulting digital signal is used to generate a video signal.

In order to generate a display on a raster scan cathode-ray tube display device without excessive artifacts, it is necessary to provide a video signal having a data rate of at least about 500 kpixel/s. Therefore, if a CCD having a single active pixel were used as the detector in a confocal microscope camera for generating a video signal in real time, it would be necessary to read charge packets from the active pixel at a frequency of at least about 500 ksamples/s. If the charge packets were shifted sequentially through a linear readout register and dumped into a floating diffusion and the voltage of the floating diffusion were sampled at a rate of 500 ksamples/s, the level of read noise, which depends on the sampling rate, may be unacceptable.

SUMMARY OF THE INVENTION

In accordance with a first aspect of the invention there is provided an optical detector including a charge-coupled device that comprises an active cell for receiving a narrow beam of incident illumination and generating photoelectrons in response thereto, a first stage readout register comprising a row of N transfer cells, where N>1, a first stage gate structure for transferring charge packets consecutively from the active cell into the first stage readout register, whereby N successive charge packets are read into the N cells respectively of the first stage readout register, N second stage readout registers each comprising M transfer cells, where M>1, a second stage gate structure for transferring N charge packets from the N cells of the first stage readout register into respective first cells of the second stage readout registers and subsequently shifting the N charge packets from the respective first cells of the second stage readout registers to respective Mth cells thereof, a multiplexer having N inputs coupled respectively to the Mth cells of the second stage readout registers and also having one output, the multiplexer being operative to connect a selected input to its output, and a multiplexer controller for consecutively selecting the inputs of the multiplexer, whereby the multiplexer provides an output signal that varies in accordance with variation in intensity of incident illumination on the active cell.

In accordance with a second aspect of the invention there is provided an optical detector including a charge-coupled device that comprises an active cell for receiving a narrow beam of incident illumination and generating photoelectrons in response thereto, a serial readout register comprising a row of N transfer cells, where N>1, a gate structure for transferring charge packets consecutively from the active cell into the serial readout register, whereby N successive charge packets are read into the N cells respectively of the serial readout register, N samplers coupled to sample the contents of the N cells respectively, a multiplexer having N inputs coupled respectively to the N samplers and also having one output, the multiplexer being operative to connect a selected input to its output, and a multiplexer controller for selecting consecutively the inputs of the multiplexer, whereby the multiplexer provides an output signal that corresponds to variation with time of intensity of incident illumination on the active cell.

In accordance with a third aspect of the invention there is provided a confocal optical system, comprising a light source for emitting a light beam, imaging optics, a scanning means, and a beam splitter operating in conjunction to direct the light beam to illuminate a spot in an object plane, deflect the light beam, whereby the spot scans the object plane, descanning light received from the object plane, and directing a descanned light beam from the scanning spot in the object plane toward an output location, a detector disposed at the output location and including a CCD that comprises a two-dimensional imaging array comprising N columns each having a plurality of active cells for receiving a descanned light beam from the beam splitter and generating multiple charge packets in response thereto, a readout register having first and second ends and comprising a row of N transfer cells, where N>1, at least one measurement cell at the first end of the readout register, said measurement cell generating photoelectrons in response to incident illumination, a first gate structure for transferring charge packets from the imaging array into the readout register, a second gate structure for transferring charge packets into the readout register from the measurement cell and transferring charge packets along the readout register in direction from the first end of the readout register toward the second end thereof, and a sense amplifier connected to the second end of the readout register for receiving charge packets therefrom and generating a detector output signal, a processor for receiving the detector output signal and extracting therefrom information regarding location at which the descanned beam is focused, and a positioning means responsive to information provided by the processor for displacing the detector to a position at which the descanned beam is focused on the measurement cell.

In accordance with a fourth aspect of the invention there is provided an optical detector including a charge-coupled device that comprises a rectangular active array of P groups of R active cells, where P>1 and R>1, for receiving a beam of incident illumination and generating PxR charge packets of photoelectrons in response thereto, a pixel accumulation register comprising a row of P transfer cells, a pixel summation super cell, a pixel summation gate structure for transferring charge packets from each group of R active cells of the rectangular active array into respective corresponding cells of the pixel accumulation register to form P charge packets in the transfer cells respectively of the pixel accumulation register and for transferring the P charge packets into the pixel summation super cell, whereby a single charge packet is formed in the pixel summation super cell, a readout register comprising a row of N transfer cells, where N>1, a readout gate structure for transferring charge packets consecutively from the pixel summation super cell into the readout register, whereby N successive charge packets are read into the N cells respectively of the readout register, a multiplexer having N inputs coupled respectively to the N transfer cells of the readout register and also having one output, the multiplexer being operative to connect a selected input to its output, and a multiplexer controller for consecutively selecting the inputs of the multiplexer, whereby the multiplexer provides an output signal that varies in accordance with variation in intensity of incident illumination on the rectangular active array.

BRIEF DESCRIPTION OF THE DRAWINGS

For a better understanding of the invention, and to show how the same may be carried into effect, reference will now be made, by way of example, to the accompanying drawings, in which.

In the several figures of the drawings, like reference numerals designate corresponding components.

DETAILED DESCRIPTION

Figure 1:
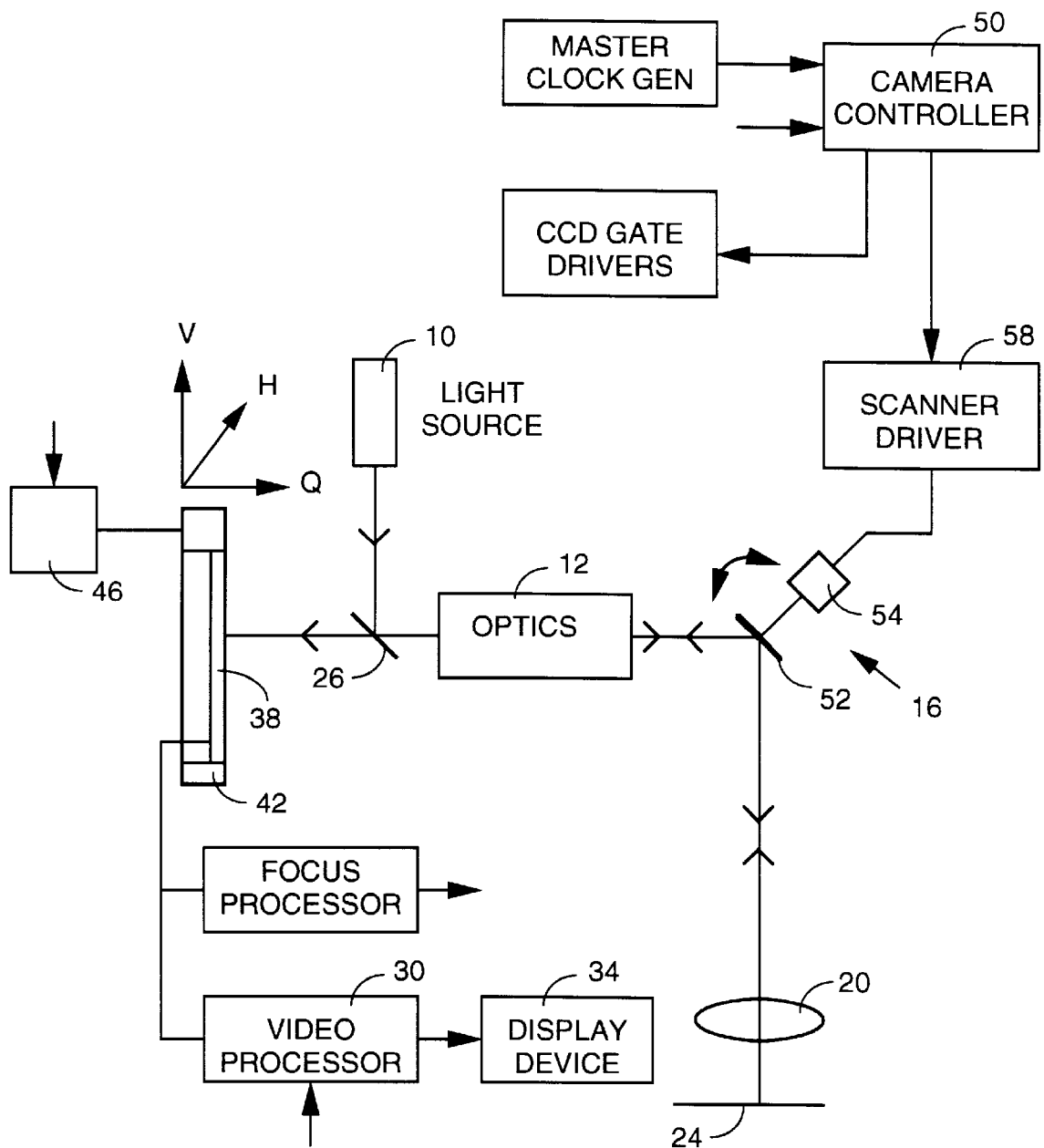
FIG. 1 is a schematic illustration of a confocal microscope camera embodying the present invention.

FIG. 1 shows a confocal microscope camera that includes a detector 38 mounted on a micropositioning stage 42 that is displaced along three mutually perpendicular axes of movement, designated H, V, and Q in FIG. 1, by motors 46 operating under control of signals provided by a camera controller 50. The Q-axis is parallel to the axis of the incident light beam from the beam splitter 26.

The camera controller 50 receives a master clock signal from a master clock generator and distributes timing and other control signals to other components of the camera. In particular, the camera controller generates and distributes a pixel clock signal, a horizontal sync signal, and a vertical sync signal.

The scanner 16 employs a pair of mirrors 52 that are deflected by use of respective piezoelectric cells 54 (not separately shown), and accordingly each mirror can be turned in discrete steps as the voltage applied to the piezoelectric cell by a scanner driver 58, which operates in response to timing signals provided by the camera controller 50, is increased in stepwise fashion. Thus, the light spot scans the object plane 24 along one axis (X) on a pixel-by-pixel basis, stepping in response to a pixel clock pulse, and after a row of pixels has been scanned, the scanner retraces along the X-axis and steps by one increment in a direction along a second axis (Y) in response to a horizontal sync pulse, and after a predetermined number of steps along the Y-axis the scanner retraces along both the X and Y axes in response to a vertical sync pulse.

Referring now to FIGS. 2–5, the detector 38 comprises a CCD die 62 that has been processed using known n-MOS integrated circuit fabrication techniques to form an array of CCD cells and associated circuit elements. The CCD die has been thinned at its back side, and each cell, projected to the back of the die, occupies an area about 36 $\mu$m square. The detector 38 is mounted on the micropositioning stage 42 so that the back surface of the CCD die is toward the beam splitter and is perpendicular to the Q-axis.

The array of CCD cells has two main parts, namely a linear row 66 and a rectangular block 70. The linear row 66 is composed of an active cell 72 (sometimes referred to herein as the active diode) at one end of the row, a transition (or inbetween) cell 74 adjacent the active cell 72, and sixteen transfer cells $76_1$–$76_{16}$ forming a horizontal register that extends parallel to the H-axis. A focus amplifier readout region 78 is disposed on the opposite side of the cell $76_{16}$ from the cell $76_{15}$.

A floating gate 80, which is connected to the input of a focus amplifier 82, is provided over the region 78. The output of the focus amplifier 82 is connected to a focus processor.

The rectangular block 70 is composed of sixteen linear columns of transfer cells, each containing 32 transfer cells. The columns of 32 transfer cells form respective vertical registers $86_j$ (j=1–16). The vertical registers $86_1$–$58_{16}$ are aligned with the cells $76_1$–$54_{16}$ respectively of the horizontal register.

Figure 3:
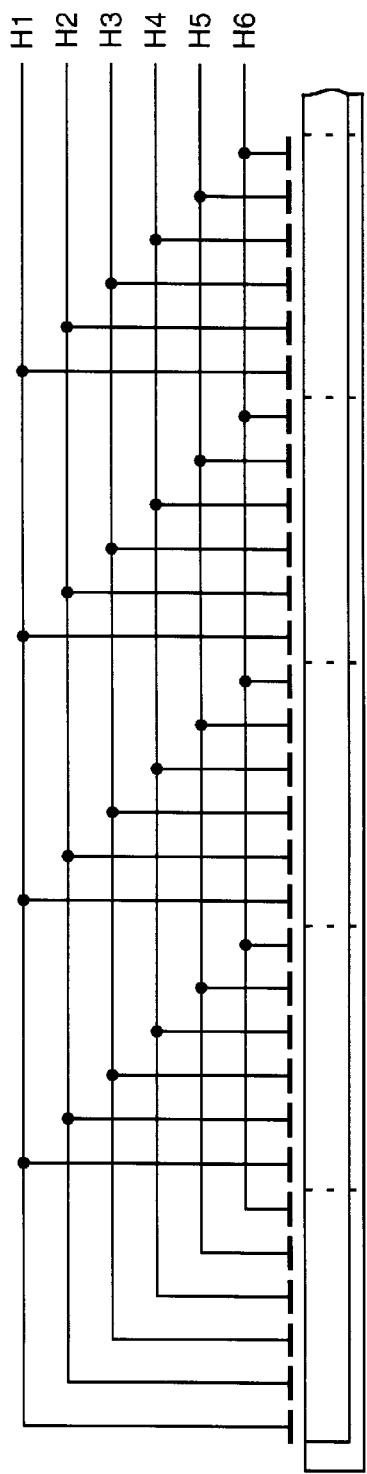
FIG. 3 is an enlarged sectional view of a portion of a horizontal register that is included in the detector shown in FIG. 2.

Referring to FIG. 3, a gate structure is provided over the front surface of the CCD die for shifting charge packets along the linear row 66. In order to achieve rapid transfer of charge packets, it is desirable that the gate length not be greater than 6 μm. Accordingly, with transfer cells that are 36 μm square, a six-phase gate structure composed of gates H1–H6 is employed. The gate structure H1–H6 is connected to a six-phase horizontal gate driver.

Figure 4:
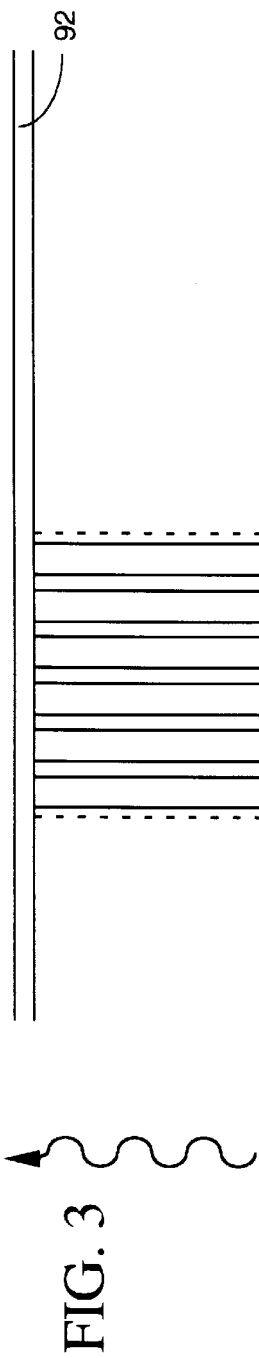
FIG. 4 is a plan view of a portion of the horizontal register and also shows a portion of several vertical registers.

The array of CCD cells is surrounded by a peripheral channel stop 92 (FIG. 4), and each two vertical registers 86 are separated from each other by a vertical channel stop 94. As shown in FIG. 4, the vertical channel stops 94 are L-shaped. The short limb of the L is at the upper end of the vertical register and, with the channel stop at the opposite edge of the vertical register, defines a narrow throat for transfer of charge into the first cell of the vertical register from the region associated with phases 1 and 2 of the corresponding cell of the horizontal register.

A six-phase vertical gate structure V1–V6 is provided on the front side of the CCD die for controlling transfer of charge packets from the cells $76_1$–$76_{16}$ into the input cells $86_{j,1}$ of the respective vertical registers, and for shifting the charge packets through the vertical registers to the output cells $86_{j,32}$. The gate structure V1–V6 is connected to a six-phase vertical gate driver. As shown in FIG. 4, at the input cell $86_{j,1}$ of the vertical register, phase 1 of the vertical gate structure extends over the short limb of the L-shaped vertical channel stop 94, and therefore the vertical registers are butted up closely to the corresponding cells of the horizontal register. This configuration allows charge to be transferred from the horizontal register to the vertical registers without need for a corner-turning gate structure over the horizontal register for that purpose.

Referring again to FIG. 2, the rectangular block 70 of CCD cells has an upper section $70_S$ of sixteen rows and a lower section $70_I$ of sixteen rows. The upper section $70_S$ of the rectangular block is used for storage, and the lower section $70_I$ is used for imaging. An opaque coating 114 is provided on the back surface of the CCD die over the storage section $70_S$ to shield it from incident light.

The dimensions of the cells of the CCD are known to a high degree of precision, such that the vertical and horizontal components of the distance between the center of the active diode 72 and the center of any cell of the imaging section $70_I$ can be calculated to an accuracy of better than +/−1 μm.

The output cells $86_{j,32}$ of the vertical registers are coupled to respective readout amplifiers 96. In the case of the implementation shown in FIG. 6, the portion of the channel region of the CCD that is associated with each vertical register includes a floating diffusion 98, which is ohmically coupled to the input of the amplifier 96. Between phase V6 of the output cell $86_{j,32}$, and the floating diffusion 98 is a last gate 106. On the opposite side of the floating diffusion 98 from the last gate 106 is a reset gate 108 and an output diffusion 110 that is ohmically coupled to ground.

Figure 5:
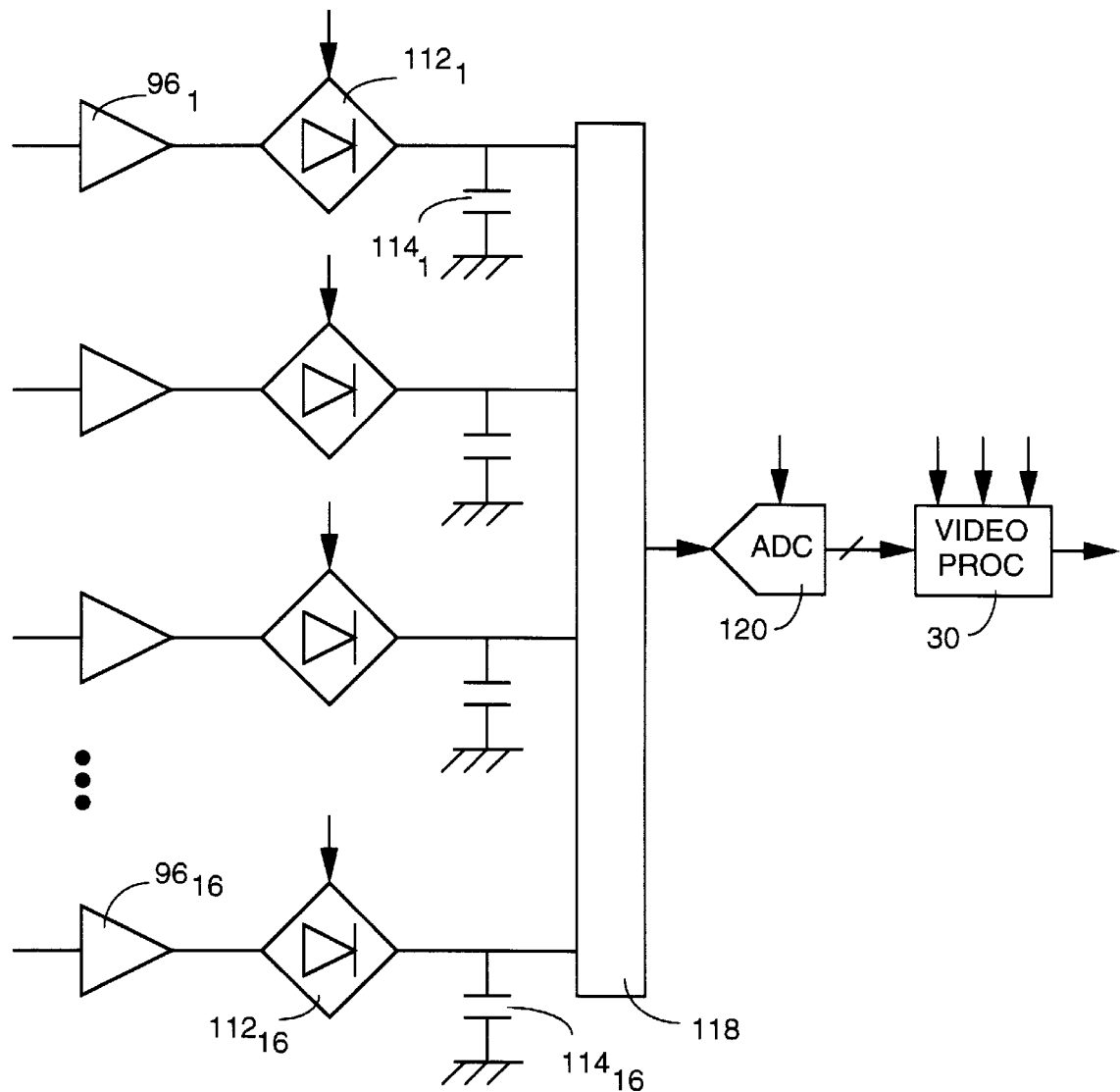
FIG. 5 is a more detailed schematic illustration of part of the detector shown in FIG. 2.

The output of each amplifier 96 is connected to an off-chip sampler 112, which supplies charge to a storage capacitor 114 (FIG. 5).

A 16×1 multiplexer 118 has sixteen inputs connected to the capacitors 114 respectively, and has an output connected to an analog-to-digital converter (ADC) 120. The ADC 120 provides a ten-bit digital signal to the video processor, which converts the ten-bit digital signal provided by the ADC 120 into a composite video signal suitable for generating a display on the raster scan display device 34.

Operation of the microscope camera is divided into a focus phase, in which the detector is brought to a position in which the beam from the beam splitter is focused on the active diode, and a measurement phase.

In the focus phase, the micropositioning stage 42 is placed at an initial position which is specified sufficiently accurately that the axis of the incident beam from the beam splitter passes through the imaging section $70_I$ of the rectangular block 70. However, the particular cell of the imaging section through which the axis of the incident beam passes is unknown, and in the general case the incident beam is not focused on the back surface of the CCD. The incident light generates photoelectrons in the imaging section. After an integration interval of about 30 ms, depending on lighting conditions, the pixel charge packets are rapidly shifted into the storage section $70_S$ of the rectangular block using conventional frame transfer techniques. The contents of the storage section are clocked out row-by-row through the horizontal register and the focus amplifier 82 during the next integration interval and are applied to the focus processor. Using known signal processing techniques, the focus processor extracts information regarding the size and location of the light spot incident on the imaging section from the signal provided by the focus amplifier. By shifting the stage along the Q-axis in accordance with the extracted information and repeating this operation, the stage can be brought to a position at which the incident beam is focused on the back surface of the CCD die. Further, by shifting the stage along the H- and/or V-axes, the stage can be brought to a position at which the beam is focused on a single cell of the imaging section.

At the end of the focus phase, the cell on which the beam is focused is known. It is a simple matter, based on the dimensions of the cells, to calculate the components along the H and V axes of the distance between the light spot and the active diode. The stage is then displaced along the H- and V-axes in order to position the detector so that the beam is focused on the active diode 72.

The subsequent measurement phase is composed of alternate integration intervals and shifting intervals. During each integration interval of about 1.8 As, the scanning mirrors remain stationary and so the scanner directs the light beam to a stationary spot in the object plane. Light from the illuminated spot is incident on the active diode and is photoelectrically converted into a pixel charge packet. Phases H1–H5 of the horizontal gate structure are held high and phase H6 is held low during the integration interval. Charge is collected efficiently under phases H1–H5 of the active diode, and the region under phase H6 serves as a barrier between the charge packet that is being accumulated and the transition cell 74.

At the end of the integration interval, pixel charge that has accumulated in the active cell 72 is shifted into the transition cell 74. It takes approximately 200 ns to clock all six phases of the gate electrode structure and shift the charge packet into the cell 74. The scanner driver receives a pixel clock pulse during the shift interval, and the scanner is indexed to deflect the light spot to the next position in the plane 24, and the integration and shifting operations are repeated. In this fashion, after seventeen integration and shifting operations, the cells $76_1$–$76_{16}$ of the horizontal register each contain a pixel charge packet.

When a pixel charge packet is received in a cell of the horizontal register, the initial condition is that phases Hi and H2 are high while phases H3–H6 are low, and so the pixel charge packets are concentrated beneath phases H1 and H2 of the respective cells of the horizontal register. When each of the cells 76 has received a charge packet, and while the initial condition still applies, the row of pixel charge packets is rapidly shifted into the vertical registers during the integration interval for the next charge packet, by driving phase V1 high and phases H1 and H2 low, so that the charge packets are forced into the region under phase V1. It takes about 50 ns to shift the row of pixel charge packets from the horizontal register into the first cells of the vertical registers. The row of pixel charge packets is then transferred downward through the vertical registers. As a given row of charge packets is transferred downwards, a succeeding row of charge packets is formed in the horizontal register.

When a charge packet is delivered to the output cell $86_{j,32}$, it is transferred into the channel region beneath the last gate 106 and is then shifted into the floating diffusion 98. The potential in the floating diffusion depends on the size of the charge packet, and accordingly the voltage at the output of the amplifier 96 depends on the size of the charge packet. The output voltage of the amplifier 96 is sampled by the sampler 112, which stores a voltage that depends on the size of the charge packet on the storage capacitor 114. The charge packet is then shifted into the output diffusion 110 and is discharged to a reference potential, thus resetting the floating diffusion to the reference potential.

The sixteen voltages, stored on the storage capacitors 114 respectively, are selected in turn using the multiplexer 118, which connects its inputs consecutively to its output in phase with the pixel clock signal and thereby provides a sampled analog output signal that varies as a function of time and reflects the variation in output voltage of the samplers across the vertical registers.

It is well known that in a sampling system, the read noise increases with the square of the sampling rate. By demultiplexing the consecutive pixel charge packets on shifting the contents of the horizontal register into the vertical registers, the rate at which the packets are sampled on reading from the vertical registers is reduced by a factor of 16, resulting in read noise being reduced by a factor of 4.

The ADC 120 resamples the sampled analog signal provided by the multiplexer 118 at a rate of 500 ks/s and quantizes the samples to 10 bits. The resulting digital data signal is supplied to the video processor 30, which combines the digital data signal with the horizontal and vertical sync signals to generate a composite video signal. When the composite video signal is applied to the display device 34, it generates an image of the object plane 24.

When the image for a particular plane in the sample has been acquired, the position of the object plane 24 relative to the sample is adjusted, either optically or by displacing the sample stage perpendicular to the plane 24, and another image is acquired. In this manner, a tomographic image of the specimen is acquired.

A filter may be deposited over the back side of the die for filtering light incident on the active diode 72. In the case in which the specimen is illuminated with white light, the filter allows the detector to select a spectral region of interest. Even when the light source is a laser that emits monochromatic light, a filter may be useful for blocking background light.

Figure 6:
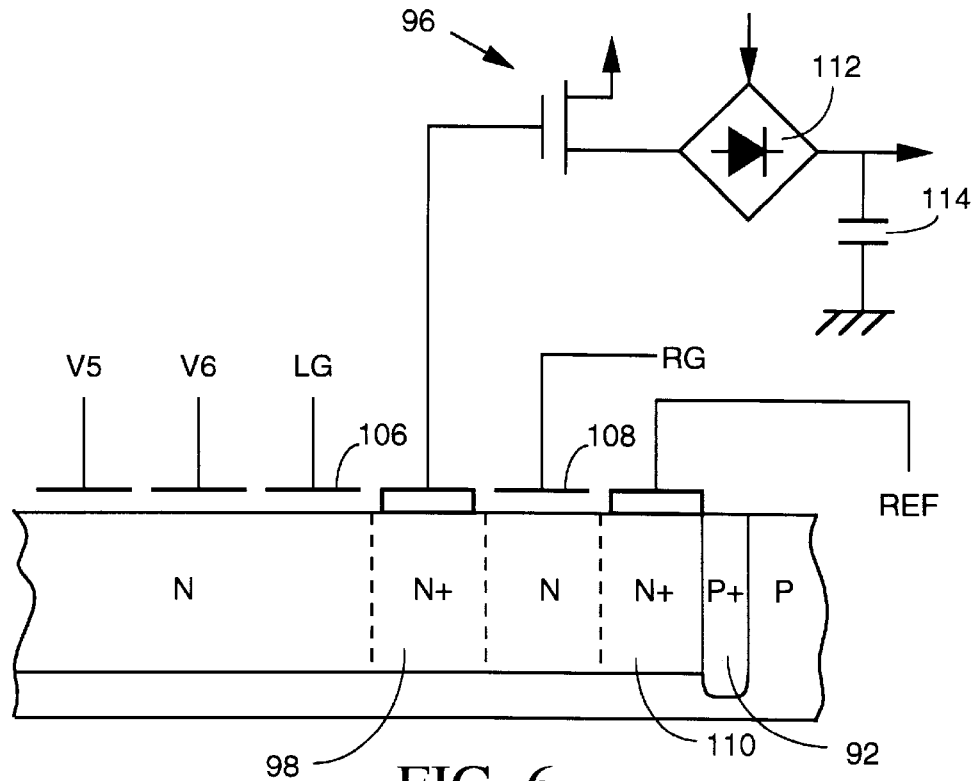
FIG. 6 is a schematic sectional view showing the output end of one of the vertical registers.
Figure 7:
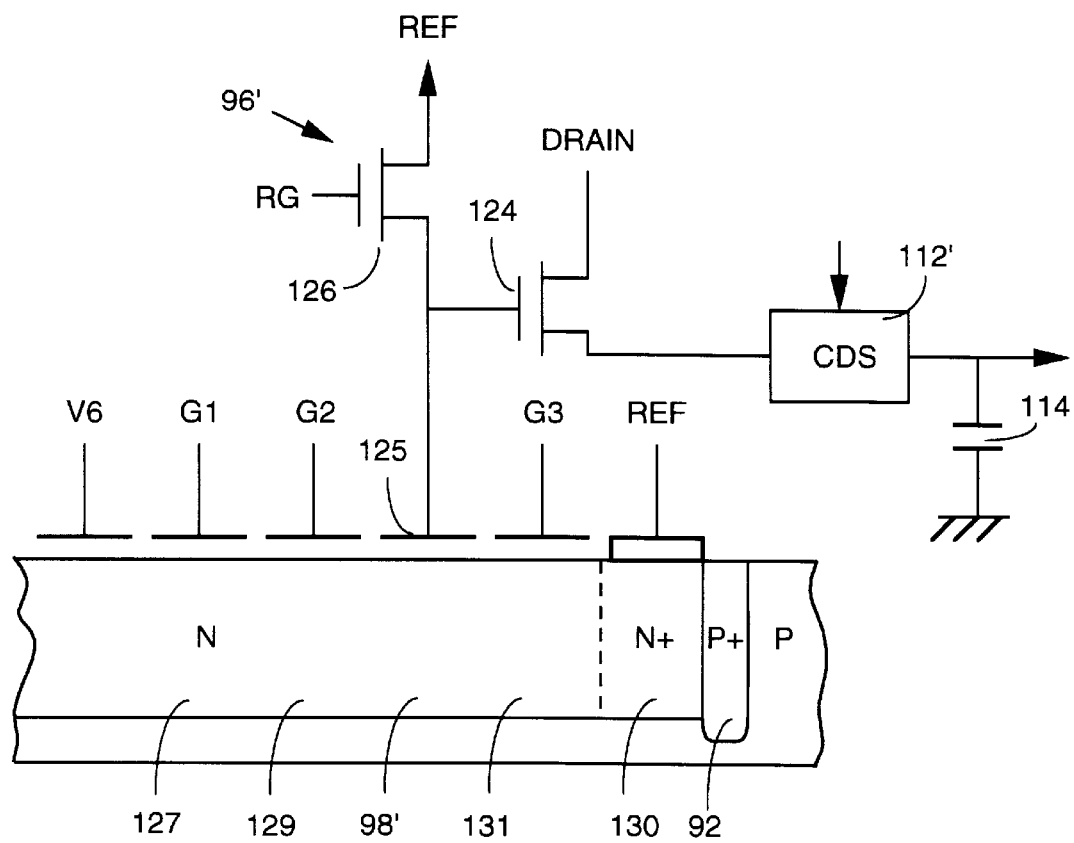
FIG. 7 is a schematic sectional view showing a preferred implementation of the output end of one of the vertical registers.

In FIG. 6, the amplifier 96 is illustrated as a simple MOSFET, but in the preferred implementation of the invention, the amplifier 96' is a low noise on-chip amplifier as described in U.S. Pat. No. 5,250,824, the disclosure of which is hereby incorporated by reference herein, and the sampler is a correlated double sampler. In this case, as shown in FIG. 7, the amplifier 96' comprises a MOSFET source follower 124 having its gate connected to a floating gate 125 over the signal channel of the vertical register and a MOSFET reset switch 126 having its source connected to the floating gate and its drain connected to a reference potential. There are two gates G1 and G2 between the floating gate 125 and the gate V6 of the last transfer cell $86_{j,32}$ of the vertical register, and there is a third gate G3 between the floating gate 125 and an electrode that connects an output diffusion 130 to a reference potential. The gates G1, G2, and G3 control respective regions 127, 129, and 131 of the signal channel. The gates G1, G2, and G3 are controlled in similar manner to that described in U.S. Pat. No. 5,250,824.

When a charge packet is delivered to the output cell $86_{j,32}$, it is transferred into the channel region 127 and is then shuttled back and forth between the regions 127 and 98', through the region 129. The gate G3 is biased to a low potential and so the region 131 serves as a barrier, and prevents the charge packet from passing to the diffusion 130. Each time the packet has been shifted from the region 98' into the region 127, the floating gate 125 is reset to a reference potential by the reset transistor 126. The transistor 126 is turned off before the charge packet is shifted back into the region 98'. The voltage at the source of the transistor 124 varies as a function of the voltage of the floating gate 125, which depends on the quantity of charge in the region 98'. After a predetermined number of shifts into and out of the region 98', e.g. sixteen, the gate G3 is driven high, allowing the charge packet to pass to the output diffusion 130, from which it is discarded to a reference potential. By repeatedly sampling the charge packet in this manner, the signal to noise ratio is increased in accordance with the square root of the number of passes through the floating region 98'.

The correlated double-sampler samples the output of the amplifier 96' on each pass of the charge packet, both just after the reset transistor 126 has been turned off and after the charge packet has been shifted into the region 98'. As is well known, the operation of correlated double-sampling generates a voltage level in which reset noise has been eliminated.

As in the case of FIG. 6, the sixteen charge packets in a row are processed concurrently by the amplifier 96' and the correlated double sampler 112', providing sixteen voltages stored on the capacitors 114 respectively. The multiplexer 118 selects the sixteen voltages in turn, in phase with the pixel clock signal, and provides a sampled analog video signal.

The floating gate amplifier shown in FIG. 7 provides the advantage of being able to achieve subelectron rms noise performance. When rms noise performance of 2 e– or higher is acceptable, the floating diffusion amplifier of FIG. 6 is adequate.

Figure 2:
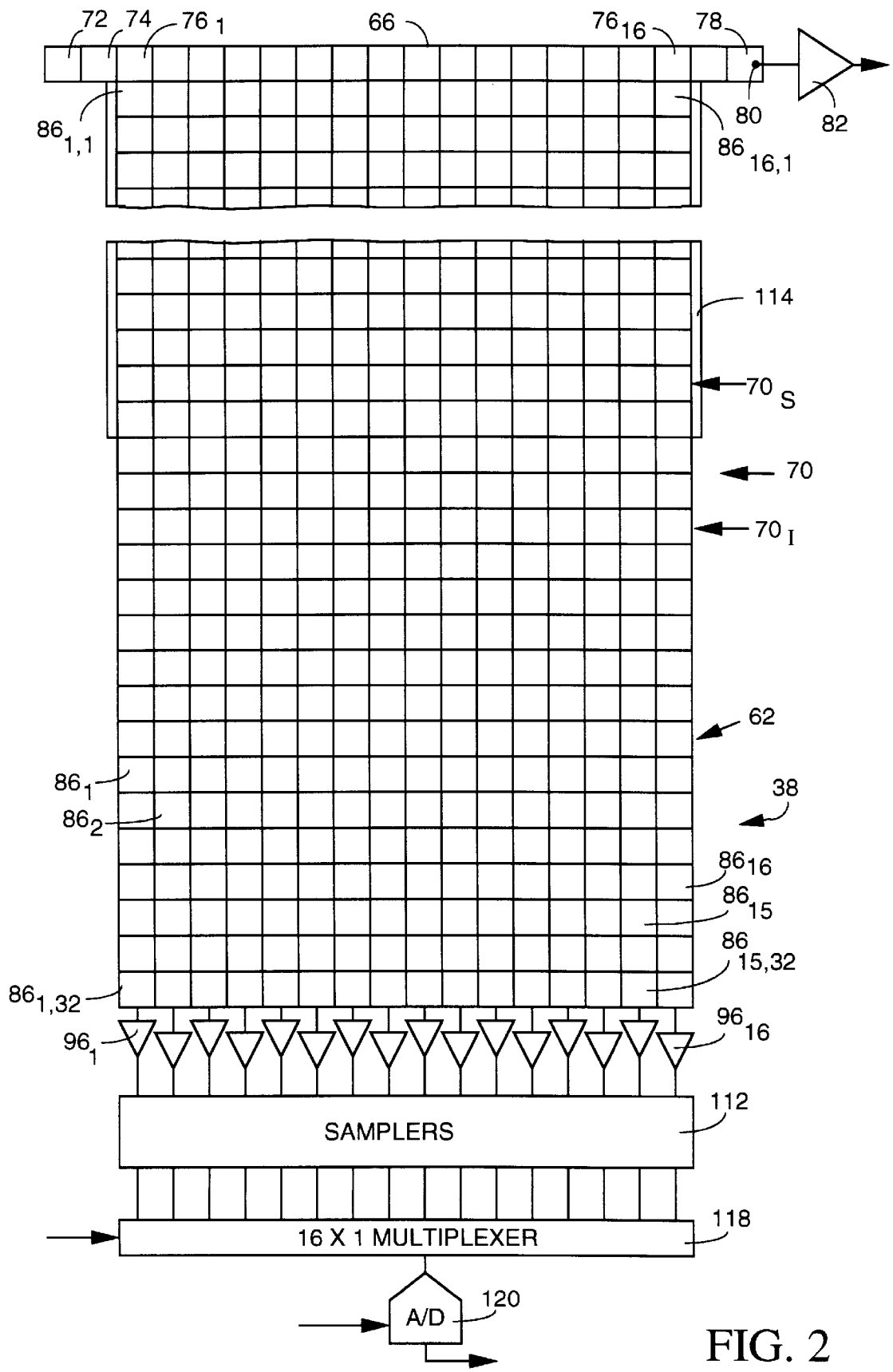
FIG. 2 is a simplified schematic illustration of a detector designed for use in confocal microscope camera shown in FIG. 1.
Figure 8:
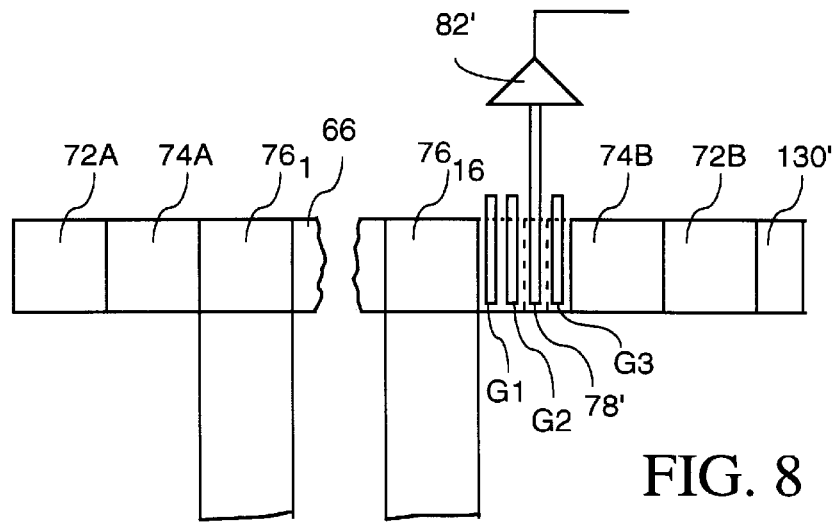
FIG. 8 is a partial view of a modification of FIG. 2, FIGS. 9 and 10 are partial plan views of alternative forms of the detectors.

FIG. 8 illustrates a modification of the detector shown in FIG. 2. In accordance with FIG. 8, the linear row 66 comprises two active cells 72A and 72B at opposite respective ends of the row and transition cells 74A and 74B between the horizontal register and the active cells 72A and 72B respectively. The focus amplifier readout region 78' is between the last cell $76_{16}$ of the horizontal register and the transition cell 74B. The floating gate amplifier 82' is similar to the amplifier 96' described with reference to FIG. 7. By controlling the gates G1, G2, and G3, charge can be delivered to the focus amplifier readout region 78' from the horizontal register 76, for readout by the focus amplifier 82, and upon completing readout of a charge packet, the charge packet can be discharged to reference potential through the output diffusion 130', or, when the active cell 72B is in use, charge packets can be delivered from the active cell 72B to the horizontal register 76 without degradation by the region between the cell 74B and the cell 76$_{16}$.

If the active cell 72A is defective, the active cell 72B can be used instead during the measurement phase. Since the horizontal gate structure has more than two phases, the horizontal clock driver can be operated to shift charge packets either to the left of FIG. 8 or to the right. If neither active cell is defective, it allows use of different filters acting on the light beam incident on the active cell. For example, during a first acquisition from a given specimen, the active cell 72A, provided with one type of filter, might be used whereas during a second acquisition from the same specimen, the active cell 72B, provided with a different filter, would be used.

Figure 9:
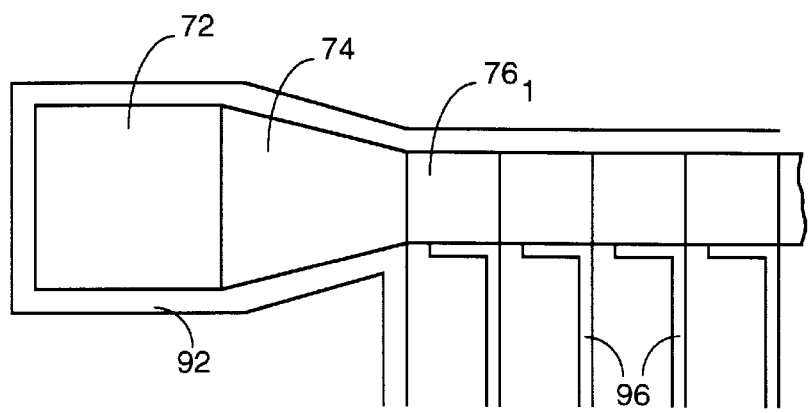

FIG. 9 illustrates a further modification of the detector shown in FIGS. 2–4. In accordance with FIG. 9, the active diode 72 is substantially larger in area than the cells of the horizontal and vertical registers. The transition cell 74 is trapezoidal, in order to provide a transition between the active cell and the first cell 76, of the horizontal register. Use of smaller cells for the horizontal and vertical registers allows more rapid transfer of charge packets through the registers, by employing shorter gates, without reducing the area over which the active cell collects light.

Figure 10:
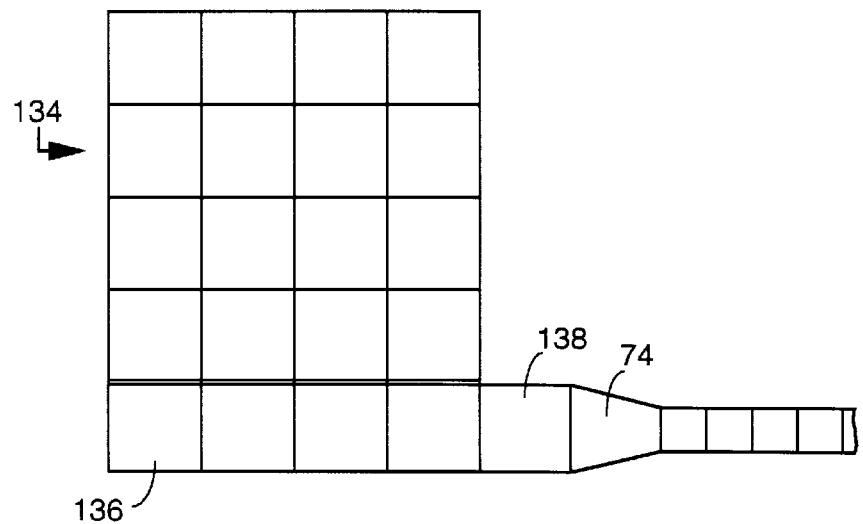
Figure 11:
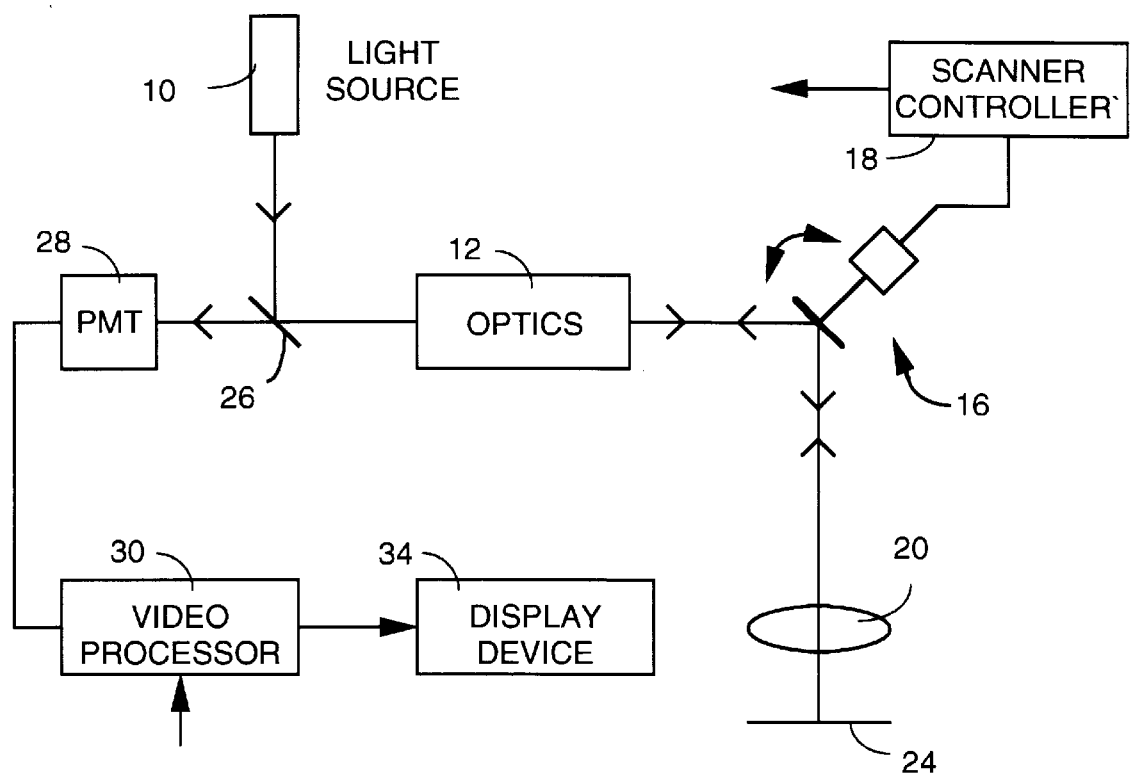
FIG. 11 is a schematic illustration of a confocal microscope camera of known type.

In a still further modification, shown in FIG. 10, the active diode is replaced with a square array 134 of active cells and a horizontal accumulation register 136 that feeds into a summation cell 138. At the end of the integration interval of the measurement phase, the pixel charge packets in the respective columns of the array 134 are summed vertically into the horizontal accumulation register 136 and the contents of the cells of the horizontal register are summed horizontally into the summation cell 138, and the superpacket in the summation cell is then shifted through the transition cell 74 into the horizontal register 66.

If the square array is composed of P×P pixels, the clock rate required to transfer charge from the square array 134 into the summation cell 138 is P×P times the rate at which pixel charge packets are transferred from the summation cell 138 to the horizontal register 66.

The structure shown in FIG. 10 renders the area over which light is collected independent of the number of phases of the gate structure. For example, with P equal to 2 it is possible to collect light over an area that is 36 μm square while using a three phase gate structure, which simplifies the gate drivers and formation of the gate structure.

It will be appreciated that the invention is not restricted to the particular embodiments that have been described, and that variations may be made therein without departing from the scope of the invention as defined in the appended claims and equivalents thereof. For example, although FIG. 2 illustrates the active cell of the detector as being square, it may be desirable for the active cell to have a different configuration. Although the invention has been described by way of example with reference to a detector in which there are sixteen vertical registers each having 32 transfer cells, in a practical implementation of the invention there may be many more than sixteen vertical registers.

I claim:

1. An optical detector including a charge-coupled device that comprises:

an active cell for receiving a narrow beam of incident illumination and generating photoelectrons in response thereto, a first stage readout register comprising a row of N transfer cells, where N>1, a first stage gate structure for transferring charge packets consecutively from the active cell into the first stage readout register, whereby N successive charge packets are read into the N cells respectively of the first stage readout register, N second stage readout registers each comprising M transfer cells, where M>1, a second stage gate structure for transferring N charge packets from the N cells of the first stage readout register into respective first cells of the second stage readout registers and subsequently shifting the N charge packets from the respective first cells of the second stage readout registers to respective Mth cells thereof, a multiplexer having N inputs coupled respectively to the Mth cells of the second stage readout registers and also having one output, the multiplexer being operative to connect a selected input to its output, and a multiplexer controller for consecutively selecting the inputs of the multiplexer, whereby the multiplexer provides an output signal that varies in accordance with variation in intensity of incident illumination on the active cell.

2. An optical detector according to claim 1, wherein the charge-coupled device comprises a transition cell between the active cell and the first stage readout register, and wherein the first stage gate structure is operative to transfer a charge packet from the active cell into the first stage readout register by way of the transition cell.

3. An optical detector according to claim 1, comprising N sensing amplifiers and N samplers coupled between the Mth cells of the second stage readout register and the inputs of the multiplexer.

4. An optical detector according to claim 3, wherein each second stage readout register further comprises a sensing region for receiving the charge packet from the Mth cell of the register, and each sensing amplifier comprises a floating gate amplifier coupled capacitively to the sensing region and means for repeatedly passing the charge packet into and out of the sensing region and resetting the floating gate to a reference potential level, whereby the floating gate amplifier repeatedly and nondestructively senses the magnitude of the charge packet.

5. An optical detector according to claim 4, wherein the sampler samples the output of the floating gate amplifier in response to each sensing of the charge packet.

6. An optical detector according to claim 5, wherein the sampler is a correlated double-sampler.

7. An optical detector including a charge-coupled device that comprises:

a first active cell for receiving a narrow beam of incident illumination and generating photoelectrons in response thereto, a second active cell for alternatively receiving the narrow beam of incident illumination and generating photoelectrons in response thereto, a first stage readout register comprising a row of N transfer cells, where N>1, the first stage readout register extending linearly between the first active cell and the second active cell, a first stage gate structure operative selectively for transferring charge packets consecutively from either the first active cell or the second active cell into the first stage readout register, whereby N successive charge packets are read into the N cells respectively of the first stage readout register, N second stage readout registers each comprising M transfer cells, where M>1, a second stage gate structure for transferring N charge packets from the N cells of the first stage readout register into respective first cells of the second stage readout registers and subsequently shifting the N charge packets from the respective first cells of the second stage readout registers to respective Mth cells thereof, a multiplexer having N inputs coupled respectively to the Mth cells of the second stage readout registers and also having one output, the multiplexer being operative to connect a selected input to its output, and a multiplexer controller for consecutively selecting the inputs of the multiplexer, whereby the multiplexer provides an output signal that varies in accordance with variation in intensity of incident illumination on the active cell.

8. An optical detector according to claim 7, wherein the charge-coupled device comprises a transition cell between the first active cell and the first stage readout register, and wherein the first stage gate structure is operative to transfer a charge packet from the first active cell into the first stage readout register by way of the transition cell.

9. An optical detector according to claim 7, comprising N sensing amplifiers and N samplers coupled between the Mth cells of the second stage readout register and the inputs of the multiplexer.

10. An optical detector according to claim 9, wherein each second stage readout register further comprises a sensing region for receiving the charge packet from the Mth cell of the register, and each sensing amplifier comprises a floating gate amplifier coupled capacitively to the sensing region and means for repeatedly passing the charge packet into and out of the sensing region and resetting the floating gate to a reference potential level, whereby the floating gate amplifier repeatedly and nondestructively senses the magnitude of the charge packet.

11. An optical detector according to claim 10, wherein the sampler samples the output of the floating gate amplifier in response to each sensing of the charge packet.

12. An optical detector according to claim 11, wherein the sampler is a correlated double-sampler.

13. An optical detector including a charge-coupled device that comprises:

an active cell for receiving a narrow beam of incident illumination and generating photoelectrons in response thereto, a serial readout register comprising a row of N transfer cells, where N>1, a gate structure for transferring charge packets consecutively from the active cell into the serial readout register, whereby N successive charge packets are read into the N cells respectively of the serial readout register, N samplers coupled to sample the contents of the N cells respectively, a multiplexer having N inputs coupled respectively to the N samplers and also having one output, the multiplexer being operative to connect a selected input to its output, and a multiplexer controller for selecting consecutively the inputs of the multiplexer, whereby the multiplexer provides an output signal that corresponds to variation with time of intensity of incident illumination on the active cell.

14. An optical detector according to claim 13, wherein the charge-coupled device further comprises N second stage readout registers coupled between said serial readout register and the N samplers respectively, and a gate structure for transferring N charge packets from first through Nth cells of the serial readout register in parallel into the second stage readout registers and subsequently supplying the N charge packets in parallel to the N samplers respectively.

15. A confocal optical system, comprising:

a light source for emitting a light beam, imaging optics, a scanning means, and a beam splitter operating in conjunction to direct the light beam to illuminate a spot in an object plane, deflect the light beam, whereby the spot scans the object plane, descanning light received from the object plane, and directing a descanned light beam from the scanning spot in the object plane toward an output location, a detector disposed at the output location and including a CCD that comprises:

a two-dimensional imaging array comprising N columns each having a plurality of active cells for receiving a descanned light beam from the beam splitter and generating multiple charge packets in response thereto, a readout register having first and second ends and comprising a row of N transfer cells, where N>1, at least one measurement cell at the first end of the readout register, said measurement cell generating photoelectrons in response to incident illumination, a first gate structure for transferring charge packets from the imaging array into the readout register, a second gate structure for transferring charge packets into the readout register from the measurement cell and transferring charge packets along the readout register in direction from the first end of the readout register toward the second end thereof, and a sense amplifier connected to the second end of the readout register for receiving charge packets therefrom and generating a detector output signal, a processor for receiving the detector output signal and extracting therefrom information regarding location at which the descanned beam is focused, and a positioning means responsive to information provided by the processor for displacing the detector to a position at which the descanned beam is focused on the measurement cell.

16. A confocal optical system according to claim 15, wherein the imaging array comprises N*M active cells and the detector further comprises a storage array comprising N columns each having M cells interposed between the imaging array and the readout register, and the first gate structure is operative to transfer charge packets from the imaging array to the storage array on a frame basis and to transfer charge packets from the storage array into the readout register on a row-by-row basis.

17. A confocal optical system according to claim 15, comprising amplifier means connected to receive charge packets shifted through the imaging array from the readout register.

18. A confocal optical system according to claim 17, wherein the amplifier means comprises N amplifiers for receiving charge packets shifted through the N columns respectively and a multiplexer having N inputs connected to the amplifiers respectively and having a single output.

19. An optical detector including a charge-coupled device that comprises:

a rectangular active array of P groups of R active cells, where P>1 and R>1, for receiving a beam of incident illumination and generating P×R charge packets of photoelectrons in response thereto, a pixel accumulation register comprising a row of P transfer cells, a pixel summation super cell, a pixel summation gate structure for transferring charge packets from each group of R active cells of the rectangular active array into respective corresponding cells of the pixel accumulation register to form P charge packets in the transfer cells respectively of the pixel accumulation register and for transferring the P charge packets into the pixel summation super cell, whereby a single charge packet is formed in the pixel summation super cell, a readout register comprising a row of N transfer cells, where N>1, a readout gate structure for transferring charge packets consecutively from the pixel summation super cell into the readout register, whereby N successive charge packets are read into the N cells respectively of the readout register, a multiplexer having N inputs coupled respectively to the N transfer cells of the readout register and also having one output, the multiplexer being operative to connect a selected input to its output, and a multiplexer controller for consecutively selecting the inputs of the multiplexer, whereby the multiplexer provides an output signal that varies in accordance with variation in intensity of incident illumination on the rectangular active array.

20. Optical apparatus including:

optics for receiving an optical signal and providing a narrow beam of illumination, and an optical detector including a charge-coupled device which comprises:

an active cell for receiving the narrow beam illumination and generating photoelectrons in response thereto, a first stage readout register comprising a row of N transfer cells, where N>1, a first stage gate structure for transferring charge packets consecutively from the active cell into the first stage readout register, whereby N successive charge packets are read into the N cells respectively of the first stage readout register, N second stage readout registers each comprising M transfer cells, where M>1, a second stage gate structure for transferring N charge packets from the N cells of the first stage readout register into respective first cells of the second stage readout registers and subsequently shifting the N charge packets from the respective first cells of the second stage readout registers to respective Mth cells thereof, a multiplexer having N inputs coupled respectively to the Mth cells of the second stage readout registers and also having one output, the multiplexer being operative to connect a selected input to its output, and a multiplexer controller for consecutively selecting the inputs of the multiplexer, whereby the multiplexer provides an output signal that varies in accordance with variation in intensity of incident illumination on the active cell.

21. Optical apparatus including:

optics for receiving an optical signal and providing a narrow beam of illumination, and an optical detector including a charge-coupled device which comprises:

an active cell for receiving the narrow beam of illumination and generating photoelectrons in response thereto, a serial readout register comprising a row of N transfer cells, where N>1, a gate structure for transferring charge packets consecutively from the active cell into the serial readout register, whereby N successive charge packets are read into the N cells respectively of the serial readout register, N samplers coupled to sample the contents of the N cells respectively, a multiplexer having N inputs coupled respectively to the N samplers and also having one output, the multiplexer being operative to connect a selected input to its output, and a multiplexer controller for selecting consecutively the inputs of the multiplexer, whereby the multiplexer provides an output signal that corresponds to variation with time of intensity of incident illumination on the active cell.

* * * * *